(12) United States Patent
Vasquez et al.

(10) Patent No.: US 8,088,224 B2
(45) Date of Patent: Jan. 3, 2012

(54) ROLL-TO-ROLL EVAPORATION SYSTEM AND METHOD TO MANUFACTURE GROUP IBIIAVIA PHOTOVOLTAICS

(75) Inventors: Jorge Vasquez, San Jose, CA (US);
James Freitag, Sunnyvale, CA (US);
Mustafa Pinarbasi, Morgan Hill, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 12/769,321

(22) Filed: Apr. 28, 2010

(65) Prior Publication Data

US 2011/0177645 A1      Jul. 21, 2011

Related U.S. Application Data

(60) Provisional application No. 61/295,567, filed on Jan. 15, 2010.

(51) Int. Cl.
*B05C 1/00* (2006.01)
(52) U.S. Cl. ............. 118/719; 118/729; 118/68; 118/58
(58) Field of Classification Search ............... 118/708, 118/719, 729, 723 R, 718, 715, 58, 66–68
See application file for complete search history.

(56) References Cited

U.S. PATENT DOCUMENTS

| | | | |
|---|---|---|---|
| 4,664,939 | A | 5/1987 | Ovshinsky et al. |
| 4,723,507 | A | 2/1988 | Ovshinsky et al. |
| 2001/0055888 | A1 | 12/2001 | Madan et al. |
| 2002/0069826 | A1 | 6/2002 | Hunt et al. |
| 2008/0175982 | A1 | 7/2008 | Robinson et al. |
| 2009/0092744 | A1 | 4/2009 | Pinarbasi et al. |

OTHER PUBLICATIONS

International Search Report issued Mar. 8, 2011 in corresponding PCT/US2011/20816.

*Primary Examiner* — Savitr Mulpuri
(74) *Attorney, Agent, or Firm* — Pillsbury Winthrop Shaw Pittman LLP (57) ABSTRACT

The present inventions provide method and apparatus that employ constituents vaporized from one or more constituent supply source or sources to form one or more films of a precursor layer formed on a surface of a continuous flexible workpiece. Of particular significance is the implementation of vapor deposition systems that operate upon a horizontally disposed portion of a continuous flexible workpiece and a vertically disposed portion of a continuous flexible workpiece, preferably in conjunction with a short free-span zone of the portion of a continuous flexible workpiece.

21 Claims, 3 Drawing Sheets

ROLL-TO-ROLL EVAPORATION SYSTEM AND METHOD TO MANUFACTURE GROUP IBIIAVIA PHOTOVOLTAICS

CROSS REFERENCE TO RELATED APPLICATIONS

This application claims priority and is related to U.S. Provisional Application No. 61/295,567 filed Jan. 15, 2010, the entire contents of which are incorporated herein by reference.

BACKGROUND

1. Field of the Inventions

The present inventions relate to method and apparatus for preparing thin films of semiconductor films for radiation detector and photovoltaic applications.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors are excellent absorber materials for thin film solar cell structures. Group IBIIIA VIA compound semiconductors includes some of: the Group IB elements of the periodic table such as copper (Cu), silver (Ag), and gold (Au); the Group IIIA elements of the periodic table such as boron (B), aluminum (Al), gallium (Ga), indium (In), and (Tl); and, the Group VIA elements of the periodic table such as oxygen (O), sulfur (S), selenium (Se), tellurium (Te), and polonium (Po). Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, compounds containing: i) Cu from Group IB, ii) at least one of In, Ga, and Al from Group IIIA, and iii) at least one of S, Se, and Te from Group VIA, are of great interest for solar cell applications. Alkali metals of Group IA, such as K, Na and Li are often included in the CIGS(S) absorbers as dopants to improve their photovoltaic properties.

Figure 1:
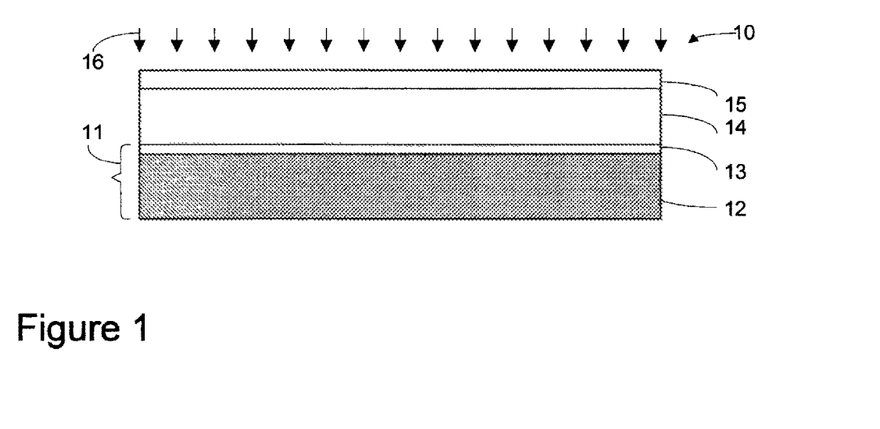
FIG. 1 is a cross-sectional schematic illustration of an exemplary solar cell structure of the prior art.

The structure of a conventional Group IBIIIA VIA compound photovoltaic cell 10 such as a $Cu(In,Ga,Al)(S,Se,Te)_2$ thin film solar cell is shown in FIG. 1. The photovoltaic cell 10 includes a base 11 having a substrate 12 and a conductive layer 13 formed on the substrate. The substrate 12 can be a sheet of glass, a sheet of metal, an insulating foil or web, or a conductive foil or web. An absorber thin film 14, which includes a material in the family of $Cu(In,Ga,Al)(S,Se,Te)_2$, is formed on the conductive layer 13. The conductive layer can be a Mo, Ta, W, or Ti layer, and functions as an ohmic contact to the photovoltaic cell. However, if the substrate 12 is a properly selected conductive material such as Ta foil or Mo foil, it is also possible not to use a conductive layer, since the substrate 12 can be used as an ohmic contact to the photovoltaic cell. After the absorber film 14 is formed, a transparent layer 15, for example, a CdS, ZnO or CdS/ZnO film stack is formed on the absorber film. Light 16 enters the photovoltaic cell 10 through the transparent layer 15. Metallic grids (not shown) are formed over the transparent layer 15 to reduce the effective series resistance of the device. The preferred electrical type of the absorber film 14 is p-type, and the preferred electrical type of the transparent layer 15 is n-type. However, an n-type absorber and a p-type window layer can also be formed. The device structure shown FIG. 1 is called a substrate-type structure. A so called superstrate-type structure can also be formed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In the superstrate structure light enters the device from the transparent superstrate side.

One technique for growing $Cu(In,Ga)(S,Se)_2$ type absorber thin films for solar cell applications is a two-stage process where metallic components or constituents of the $Cu(In,Ga)(S,Se)_2$ material, i.e. Cu, In and Ga, are first deposited onto a substrate, and then reacted with the non-metallic constituents (or semi-metallic constituents), i.e. S and/or Se, in a high temperature annealing process. Alternatively, Group VIA material layers can be also included in the precursor. For example, Se and/or S can be deposited over a stack of Cu, In and/or Ga films, and this precursor stack is annealed at elevated temperatures (400-600° C.) to initiate reaction between the metallic elements and the Group VIA material(s) to form the $Cu(In,Ga)(S,Se)_2$ compound. During the annealing, additional Se and/or S sources, such as Se and S vapors, or Se and S containing gases can be also delivered into the reactor. Selenium vapor migration to adjacent stations and equipment is an important problem in deposition systems using Se evaporators. In such systems, during the deposition, selenium vapor migrates to adjacent deposition stations or end stations and the mechanisms such as winding mechanisms in the end stations or various rollers supporting the web during the deposition. One prior art solution is to increase free-span distance of the web to move adjacent stations and winding mechanisms further away from selenium evaporators. However there are drawbacks with this solution, because a longer span causes the web to droop with a catenary shape, which results in degradation of uniformity in the depositing layer due to uneven tension. Such large free span also increases system footprint. The absorber layer 14 shown in FIG. 1 may contain dopant elements, such as Na to enhance cell performance, in addition to the primary elements (Cu, In, Ga, Se and/or S) required to form the absorber layer. Prior research on possible dopants for Group IBIIIA VIA absorber layers has shown that alkali metals, such as Na, K, and Li, affect the structural and electrical properties of such absorber layers. Especially, inclusion of Na in CIGS layers was shown to be beneficial for their structural and electrical properties and for increasing the conversion efficiencies of solar cells fabricated on such layers provided that its concentration is well controlled.

Design of a system to carry out Group VIA material and/or dopant material deposition is critical for the quality of the resulting absorber film, the efficiency of the solar cells, throughput, material utilization and cost of the process. The deposition flux from thermal sources tends to vary considerably during the deposition processes. Having the ability to measure and control deposition flux is critical for process stability. Therefore, there is need for new processes and tools to deposit such layers efficiently to form high quality, low cost CIGS type absorber layers for solar cells.

SUMMARY

The present inventions provide method and apparatus that employ constituents vaporized from one or more constituent supply source or sources to form one or more films of a precursor layer formed on a surface of a continuous flexible workpiece.

Of particular significance is the implementation of vapor deposition systems that operate upon a horizontally disposed portion of a continuous flexible workpiece and a vertically disposed portion of a continuous flexible workpiece, preferably in conjunction with a short free-span zone of the portion of a continuous flexible workpiece.

In one aspect is provided a roll-to-roll system for depositing a plurality of films of Group IA and Group VIA materials on a front surface of a continuous sheet shaped workpiece that is advanced in a process direction, comprising: a process housing through which the continuous sheet shaped workpiece is advanced between an entrance opening and an exit opening of the process housing, the process housing including a first process section located by a horizontal peripheral wall of the process housing and a second process section located by a vertical peripheral wall of the process housing, wherein the first process section is associated with a horizontally disposed portion of the continuous sheet shaped workpiece and the second process section is associated with a vertically disposed portion of the continuous sheet shaped workpiece; a workpiece tensioning and drive assembly for advancing the continuous sheet shaped workpiece in the process direction between the entrance opening and the exit opening of the process housing; a first deposition station including at least a first deposition unit disposed at the first process section to continuously deposit a first film onto the horizontally disposed portion of the continuous sheet shaped workpiece as the continuous sheet shaped workpiece is advanced through the at least first deposition unit; and a second deposition station including at least a second deposition unit disposed at the second process section to continuously deposit a second film onto the vertically disposed portion of the continuous sheet shaped workpiece as the continuous sheet shaped workpiece is advanced through the at least second deposition unit; wherein one of the first and second deposition stations deposits directly onto a front surface portion of the continuous sheet shaped workpiece to obtain a new front surface portion and the other of the first and second deposition stations deposits onto the new front surface portion.

In a preferable aspect to the above, the first deposition station deposits directly onto the front surface portion of the continuous sheet shaped workpiece to obtain the new front surface portion and the second deposition station deposition stations deposits onto the new front surface portion.

In another aspect is provided a method of vapor depositing a plurality of films of Group IA and Group VIA materials on a front surface of a continuous workpiece that is advanced in a process direction in a roll-to-roll deposition system, comprising: advancing the continuous workpiece in a process direction between an entrance opening and an exit opening of a process housing, the process housing including a first process section and a second process section, wherein the first process section is associated with a horizontally disposed portion of the continuous workpiece and the second process section is associated with a vertically disposed portion of the continuous workpiece; depositing a first film over a front surface portion of the front surface of the horizontally disposed portion of the continuous workpiece, wherein the deposition of the first film uses at least one first evaporation deposition apparatus disposed at the first process section to continuously deposit the first film on a portion of the front surface of the continuous workpiece as the continuous workpiece is advanced through the at least one first evaporation deposition apparatus; and depositing a second film over a surface portion of the first film of the front surface of the vertically disposed portion of the continuous workpiece, wherein the deposition of the second film uses at least one second evaporation deposition apparatus disposed at the second process section to continuously deposit the second film on a portion of the front surface of the first film of the continuous workpiece as the continuous workpiece is advanced through the at least one first evaporation deposition apparatus.

DESCRIPTION OF THE PREFERRED EMBODIMENTS

The preferred embodiments as describe herein provide systems to deposit multiple material layers using evaporation techniques, and methods that use the systems. Specifically are discussed methods and apparatus to deposit Group VIA and Group IA materials to form precursor layers for CIGS(S) type absorbers of solar cells or photovoltaic cells, in an in-line manner, preferably in a roll-to-roll or reel to reel manner. In-line processing where a precursor or a portion of a precursor is formed on a workpiece while the workpiece is moved continuously through a deposition system is attractive for manufacturing. Roll-to-roll processing technology increases throughput and minimizes substrate handling.

One embodiment comprises: a first deposition station to deposit a first material, for example, a Group material IA material, or a dopant material, on a surface of a continuous flexible workpiece, such as one of Na, K and Li; and a second deposition station to deposit a second material, for example, a Group VIA material such as Se over the Group IA material deposited in the first deposition station. The first and second deposition stations may preferably be evaporation deposition stations. The thickness of the films deposited in the first and second deposition stations in this embodiment of the invention may depend on the thickness of the precursor layers and resultant absorber layer thickness, and may be within the range of 10 to 50 nm and 1 to 4 μm, respectively. The continuous flexible workpiece may include a base having a flexible substrate, such as a stainless steel or aluminum foil substrate or web, and a contact layer such as a Mo, W, Ru, Os and Ir layer, or their multilayer stacks including two or more layers, or other materials used as solar cell contact layers. The workpiece may be a stainless steel web of thickness between 25 and 100 μm and width between 300 and 1000 mm or wider. The continuous flexible workpiece also includes a first portion of a precursor layer, comprising at least some of the precursor materials to form an absorber layer, formed over the contact layer. As will be described more fully below, in this embodiment, the system is used to form a second portion of the precursor layer on the first portion to complete the precursor structure before an annealing and reaction step described above in the background section. The second portion of the precursor layer includes, in a particular embodiment, the first material, e.g., a Group IA material, and the second material, e.g., a Group VIA material. The precursor materials of the first portion of the precursor layer may comprise the constituents of a CIGS(S) type absorber layer such as Cu, In and Ga, and optionally Se. The first portion of the precursor layer may be formed as a stack including films of the constituent materials, or films including their alloys, deposited on top of each other in various orders, such as Cu/In/Ga, Cu/Ga/Cu/In, Cu/In/Ga/Se, Cu/Ga/Cu/In/Se or any other order combination.

During the deposition process, the continuous flexible workpiece may be supplied from a supply roll; advanced through the first and the second deposition stations along a process direction to form the precursor layer; and picked up and wound as a receiving roll. In the system, the first deposition station includes a first deposition chamber to deposit the first material preferably from a first material vapor onto the workpiece and the second deposition station includes a second deposition chamber to deposit the second material preferably from a second material vapor onto the first material. The first and second deposition chambers are isolated from one another so that the vapor produced in one of the chamber does not migrate to the other chambers or outside of them, preferably both. The first and the second deposition chambers are preferably elongated chambers that extend along a first process axis and a second process axis, respectively. The first process axis may be a horizontal axis and the second process axis may be a vertical axis that is perpendicular to the first process axis. In this configuration, as the workpiece is fed from the supply roll into the first deposition chamber in the process direction, the workpiece travels parallel to the first process axis while the first material is deposited onto the workpiece surface. The workpiece with the first material leaves the first deposition chamber and enters the second deposition chamber where the workpiece travels vertically parallel to the second process axis while the second material deposits onto the first material, thereby forming the precursor layer. The workpiece with the precursor layer leaves the second deposition chamber and is wound around the receiving roll.

Figure 2A:
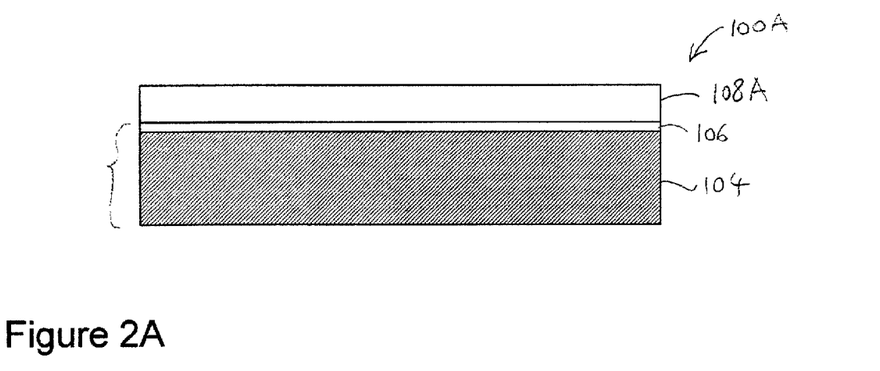
FIG. 2A is a cross-sectional schematic illustrations of a continuous flexible workpiece having a partial precursor layer.
Figure 3A:
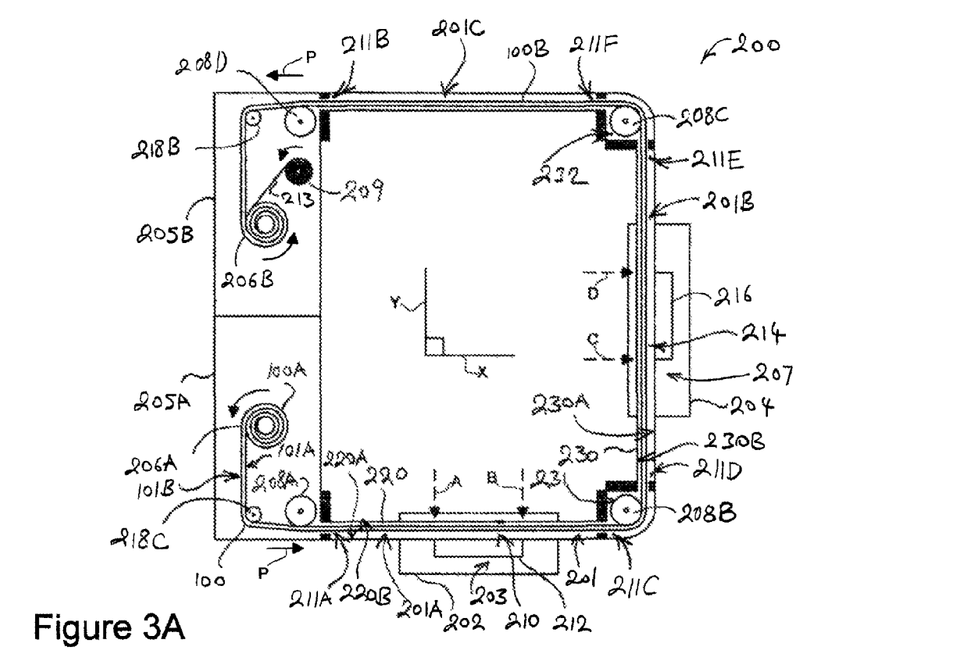
FIG. 3A is a side view schematic illustration of an embodiment of a deposition system of the present invention.

FIG. 2A show an exemplary unprocessed portion 100A of a continuous flexible workpiece 100 (shown in FIG. 3) to process using the system 200 (shown in FIG. 3). The continuous flexible workpiece 100 is also referred to as workpiece herein. The unprocessed portion 100A includes a base 102 having a substrate 104, such as a stainless steel foil, and a contact layer 106 such as a Mo, W, Ru, Os or Ir layer, formed over the substrate 104. The contact layer may also be a Mo layer deposited onto the substrate and a Ru layer deposited on the Mo layer. A thin Cu layer with a thickness between 10 and 100 nm may be deposited on the Ru layer. A first precursor layer portion 108A including Cu, In, and Ga, and optionally Se is formed over the contact layer 106. The first precursor layer portion 108A may be formed using any deposition methods such as electroplating, evaporation, sputtering, nano particle coating and the like.

Figure 2B:
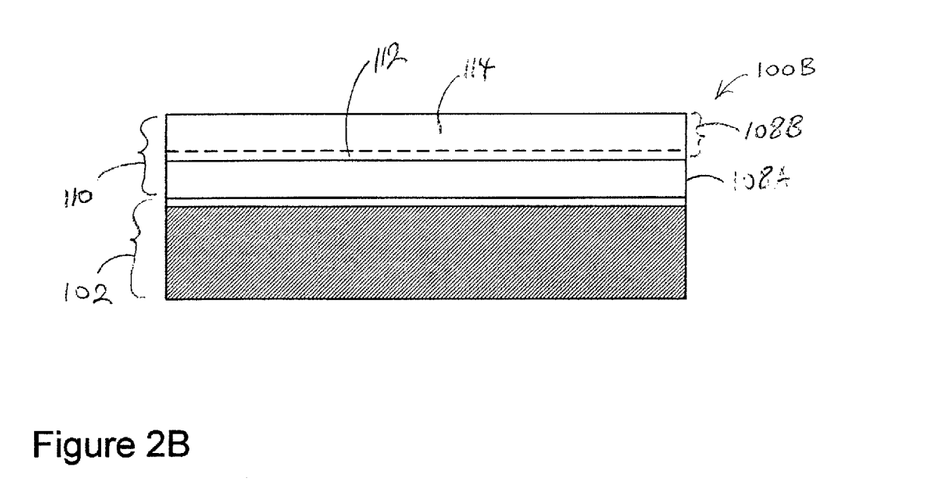
FIG. 2B is a cross-sectional schematic illustrations of the continuous flexible workpiece of FIG. 2A having a precursor layer formed in a system of the present invention.

FIG. 2B shows a processed portion 100B of the workpiece 100 (shown in FIG. 3) including a precursor layer 110 formed by depositing a second precursor layer portion 108B onto the first precursor layer portion 108A using the system 200. The first and second precursor layer portions form the precursor layer 110. The second precursor layer portion 108B may be formed using two deposition steps which preferably employ an evaporation process of the present invention. In a first step of the process, a first film 112 of a first material including a dopant material, such as Na, may be deposited onto the first precursor layer portion 108A of the unprocessed portion 100A of the workpiece 100. In a second step of the process, a second film 114 of a second material including a Group VIA material, such as Se, may be deposited onto the first film 112 to complete the formation of the precursor layer 110. The second film 114 forms top of the processed portion 100B of the workpiece 100.

FIG. 3A shows in side view an embodiment of the roll to roll deposition system 200 processing the workpiece 100. The deposition system 200 includes a process housing 201, a first deposition station 202 to deposit the first material including a Group IA material (dopant material), such as Na, Li or K, to form the first film 112 (FIG. 2B) and a second deposition station 204 to deposit the second material including a Group VIA material such as Se to form the second film 114 (FIG. 2B). As described above, the first material and the second material form the second precursor portion 108B (see FIG. 2B) including a dopant material and Se which completes the formation of the precursor layer 110 on the workpiece 100.

The process housing 201 extends between a loading station 205A and an unloading station 205B of the deposition system 200. The process housing 201 preferably includes a first section 201A, a second section 201B and optionally a third section 201C, such that associated with each section is a deposition station as described herein. The first deposition station 202 is located within the first section 201A such that a horizontal portion of the continuous flexible workpiece 100 is advanced from the loading station 205A through the first deposition station 202, and within the first deposition station 202 a horizontal process gap is maintained between a front surface of that portion of the continuous flexible workpiece therein and a first deposition unit, described further hereinafter, that is associated with the first deposition station 202. The second deposition station 204 is located within the second section 201 B such that a vertical portion of the continuous flexible workpiece 100 is advanced through the second deposition station 204, and within the second deposition station 204 a vertical process gap is maintained between a front surface of that portion of the continuous flexible workpiece therein and a second deposition unit, described further hereinafter, that is associated with the second deposition station 204. The third section 201C is located in the process direction between the second section 201B and the unloading station 205B and provides a path for the continuous flexible workpiece 100 to the unloading station 205B. The third section 201C is a cooling zone, may have an active cooling unit disposed therein, and as illustrated is in a preferred embodiment is parallel to the first section 201A. The first section 201A is defined by a first peripheral wall 220 including a first wall 220A, a second wall 220B and side walls (not shown). The first and the second side walls of the first section 201A are preferably parallel to one another, and the distance between the first wall 220A and the second wall 220B becomes the gap height of the first section 201A. The second section 201B is defined by a second peripheral wall 230 including a first wall 230A, a second wall 230B and side walls (not shown). The first and the second side walls of the second section 201B are preferably parallel to one another and the distance between the first wall 220A and the second wall 220B becomes the gap height of the second section 201B. In both sections, the gap height is in the range of 1 cm to 20 cm, preferably 1 to 5 cm. During the process, the unprocessed portion 100A of the workpiece 100 is unwound from a supply roll 206A located in the loading station 205A; advanced in a process direction 'P' while being processed in the first deposition station 202 and the second deposition station 204; and the processed portion 100B of the workpiece 100 is picked up and wound as a receiving roll 206B located in the unloading station 205B. The unloading station 205B may also include an interleaf roll 209 to provide a protective interleaf sheet 213 onto the front surface 101B of the workpiece as it is wound.

When moved in the system 200 by a moving mechanism (not shown), a back surface 101A of the workpiece 100 is supported by a number of auxiliary rollers, such as primary rollers 208A-208E, and secondary rollers 218A and 218B while a front surface 101B of workpiece is left exposed for the aforementioned deposition processes without being physically touched by any system component, i.e., rollers or the like. The auxiliary rollers 208A-208E, 218A and 218B are utilized to support, tension and change the direction of motion of the workpiece or the angle of the direction of motion. As will be described more fully below, the workpiece 100 is advanced from the loading station 205A though a first sealable gate 211A of the process housing 201. After traveling through the first section 201A, the second section 201B and the third section 201C, the workpiece 100 enters into unloading station 205B through the second sealable gate 211B of the process housing 201, in its tensioned state. The primary rollers 208A and 208D are placed within the loading and unloading stations in very close proximity of the sealable gates 211A and 211B respectively.

The workpiece 100 also preferably passes through a third sealable gate 211C placed after the first section 201A, adjacent and before the primary roller 208B. Also, optionally, a fourth sealable gate 211D placed before the second section 201B and after the primary roller 208B may be included. Also, optionally a fifth sealable gate 211E placed after the second section 201B and before the primary roller 208C can be used. Also, and optionally, a sixth sealable gate 211F placed before the third section 201C and after the primary roller 208C can be used. In this respect, the primary rollers 208B and 208C are positioned at the corners of the system at roller positions 231 and 232, and are sealed by the sealable gates 211C, 211D and 211E, 211F respectively.

With usage of the sealable gates 211, this also allows the control of the different chambers, such that one deposition chamber can be being used for service (deposition or other processing occurring within) while the others are under vacuum (without deposition or other processing occurring).

The primary roller 208B changes the orientation of the workpiece from horizontal to vertical, and the primary roller 208C again changes the orientation, this time from vertical to horizontal. The secondary rollers 218A and 218B further tension the workpiece by causing a wrap angle of about 15° at the primary rollers 208A and 208B respectively. The sealable gates 211A-211F may preferably be rectangular narrow slits which are dimensioned very close to the width and thickness of the work piece 100. The mechanics of moving the workpiece within the process housing 201 and through the sealable gates will be described below in connection with FIGS. 3B-4B. The sealable gates 211A-211F block any material vapor migration into adjacent sections and the loading and unloading chambers and allow independent servicing of the deposition stations while maintaining vacuum in adjacent stations.

Referring to FIGS. 2A, 2B and 3A, it will be appreciated that, although it is referred to as the front surface 101B for clarity, the front surface 101B of the workpiece has different material films, which are described above, at various stages of the process performed in the system 200. For example, before entering the first deposition station 202, the front surface 101B includes the first precursor portion 108A; before entering the second deposition station 204, the front surface 101B includes the first film 112 deposited onto the first precursor portion 108A; and, after the second deposition station 204, the front surface 101B includes the second film 114.

Referring back to FIG. 3A, the first deposition station 202 includes a first deposition unit 203 with a first deposition chamber 210 and a first evaporation apparatus 212, to provide the first material vapor, e.g., Na vapor, to form the first film 112 on the front surface 101B while the workpiece 100 is advanced in a horizontal direction through the first deposition chamber 210 of the first deposition station 202. The first evaporation apparatus 212 is located across from the front surface 101B of the workpiece within the first deposition chamber 210, which chamber 210 is also referred to herein as the horizontal process gap, which is in certain embodiments a subset area of the first section 201A, as explained more fully below. The evaporation apparatus 212 is preferably mounted so that vapor therefrom is provided through an opening in a peripheral wall of the first section 201A to an area within the first section 201A where deposition occurs, and which area is thus referred as the first deposition chamber 210. The first deposition chamber 210 will preferably occupy a portion of the first section 201A, for example the portion between the points 'A' and 'B'. The horizontal direction of travel of the workpiece 100 through the first deposition chamber is parallel to an X-axis shown in FIG. 3. Although in this embodiment, the first deposition station 202 has only one deposition unit, it may include a plurality of other deposition units to deposit other materials, and this aspect is within the scope of the present invention.

The second deposition station 204 includes a second deposition unit 207 with a second deposition chamber 214 and a second evaporation apparatus 216, to provide the second material vapor, i.e., Se vapor, to form the second film 114 on the vertically disposed front surface 101B while the workpiece 100 is advanced vertically up and through the second deposition chamber 214 of the second deposition station 204. The second evaporation apparatus 216 is located across from the front surface 101B of the workpiece within the second deposition chamber and is capable of delivering the deposition vapor to a vertically disposed workpiece, which chamber 214 is also referred to herein as the vertical process gap, which is in certain embodiments a subset area of the first section 201B, as explained more fully below. The second evaporation apparatus 216 is preferably mounted so that vapor therefrom is provided through an opening in a peripheral wall of the second section 201B to an area within the second section 201B where deposition occurs, and which area is thus referred as the second deposition chamber 214. The second deposition chamber 214 will preferably occupy a portion of the second section 201B, for example the portion between the points 'C' and 'D'. Although in this embodiment, the second deposition station 204 has only one deposition unit, it may include a plurality of other deposition units to deposits other materials.

The vertical orientation of the second deposition chamber 214 is parallel to a Y-axis shown in FIG. 3 so that the workpiece 100 is advanced vertically up in the second deposition chamber 214. As shown in FIG. 3A, during the deposition of Se, since the portion of the workpiece being operated upon is in vertical orientation, there will not be a need to apply high tension to flatten the workpiece; as a result, the Se layer deposits in a uniform manner. Further, the deposition of Se happens in a so called free span zone where no roller or other moving component of the system touches the workpiece 100. This advantageously prevents excess Se build up on such components and thereby reduces system downtime for cleanups and the associated cost. In this embodiment, the first peripheral wall 220 of the first section 201A and the second peripheral wall 230 of the second section 201B are shielded by replaceable shield layers (not shown) or plates made of a metal or ceramic The shield layers may be partially or fully cooled by cooling systems to collect excess material vapors on the shield layers so that such vapors do not deposit onto other system components or the peripheral walls of the sections and limit migration of Se into adjacent zones. Shield layers with excess material deposits are replaced in process intervals. The vertical configuration of the second deposition station 204 also effectively reduces system foot-print and provides a compact system. The vertical configuration of the second deposition station 204, along with the horizontal configuration of the first deposition station 202, also results in a line-of-sight of the vapor depositing of the second deposition station not being within the line-of-sight of the first deposition station, and likewise the line-of-sight of the vapor depositing of the first deposition station not being within the line-of-sight of the second deposition station.

In the deposition system 200, each deposition step is performed when the workpiece 100 is in a free span zone. This aspect of the present invention will now be further described with help of FIG. 3B which is a simplified illustration of FIG. 3A to explain mechanics of free-span configurations in the system 200. Accordingly, in the system 200 as shown, the workpiece 100 has three sequential free-span zones as it travels in the process direction, namely a first free span zone 250A or a first horizontal free-span zone, a second free span zone 250B or a vertical free span zone, and a third free-span zone 250C or a second horizontal free-span zone. The first free-span zone 250A occurs while the workpiece is tensioned between the primary roller 208A and 208B to deposit the dopant material (depicted by arrows, though occurring within the deposition unit) onto the front surface 101B. As mentioned above in the background section, in the prior art, long free span zones causes workpiece to droop with a catenary shape resulting in changes in the uniformity of the depositing layer due to uneven tension.

Figure 3B:
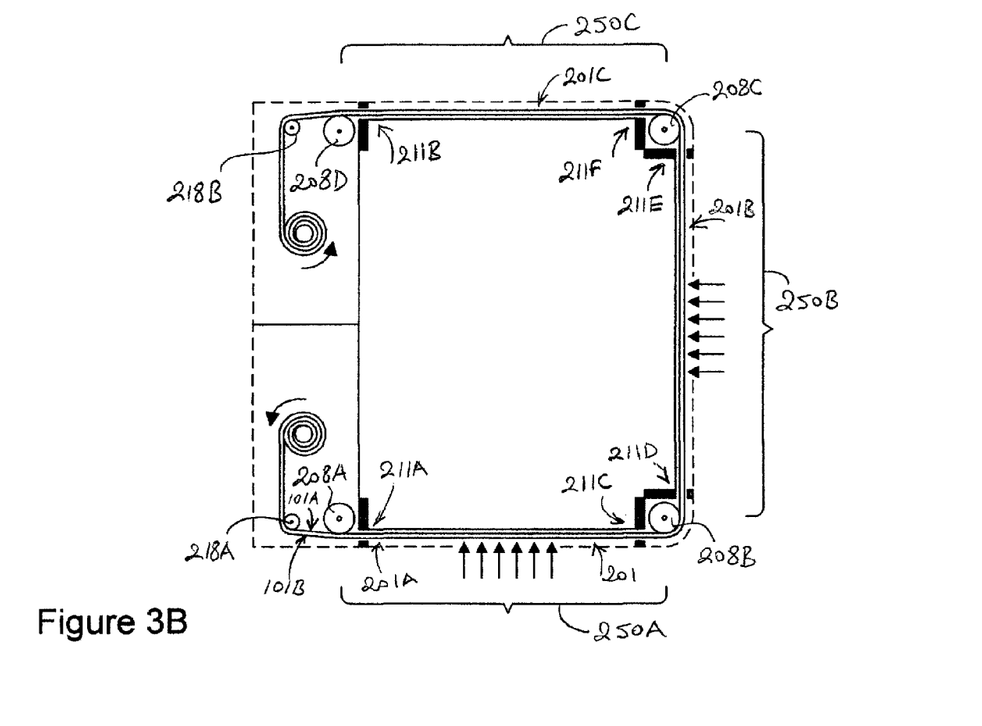
FIG. 3B is a schematic illustrations of free span positions of the deposition system shown in FIG. 3A.

For example, a 1 m wide, 50 μm thick stainless steel web or substrate at a tension of 900 Newton (N) will deflect by nearly 1.4 cm at the center of a 5 m free-span. By reducing the free-span to 2.5 m, the deflection of the same web at the center will be only 0.3 cm. Moreover, for wide substrates especially, it is difficult to evenly tension across the width due to non-flat web shape and imperfect web path alignment. In this case, the tension applied to the web may be concentrated at one of the two edges, both edges, or somewhere between both edges. The web may further develop tramlines, diagonal ripples that travel across the web in the free span. The portion of the web under lower tension will deflect more than the portion at higher tension and thereby degrade the deposition uniformity since the distance from the deposition source to the substrate will vary and, generally, deposition flux varies inversely proportional to the square of the distance. As in the example above, increasing the free-span of the web will exacerbate the deflection and consequent degradation of deposition uniformity. For example, if the nominal distance from a deposition source to web is 15 cm and a free span of 5 m, a deflection of 1.4 cm in the center of the web would reduce the distance to the deposition source to 13.6 cm and increase the deposition rate by over 20%. In contrast, for a 2.5 m free-span, with a deflection of 0.3 cm, the deposition rate would increase by only 4%. By separating the primary rollers 208A and 208B so that there is a minimum spacing between them while still allowing the deposition unit 202 to exist therebetween will minimize the free span zone length. Since the workpiece 100 is also made substantially horizontal and flat between the primary rollers 208A and 208B, this allows deposition of layers with uniform thickness. As will be described below, when the workpiece 100 is horizontal and flat in the first free-span zone, sealable gates 211A and 211B may be advantageously made as very narrow slits. Such sealable gates with narrow slits, when open during deposition, provide a better seal against the escape of undesired vapors from the deposition units 202 and 204 produced during the deposition process.

Due to the vertical orientation of that portion of the workpiece 100 being operated upon in the second deposition station 204, the second free-span zone 250B is not susceptible to the drawbacks of the horizontal free span zones, as the second free span zone is less susceptible to bowing in the middle between horizontally disposed rollers. Rather, in the second free-span zone 250B, due to the vertical position of the workpiece 100, flatness of the workpiece is inherently achieved and advantageously established even if the second free-span zone is made longer than the first free span-zone 250A, since the second free-span zone 250B is established by and is located between the primary rollers 208B and 208C and the vertically disposed workpiece portion therebetween. As such, when depositing the selenium (depicted by arrows) onto the portion of the front surface 101B of the workpiece 100, the portion of the workpiece 100 that is vertically disposed essentially hangs from the top roller 208C, and so even without tension the weight of the vertical workpiece portion will result in the desired flatness, and under slight tension between primary rollers 208B and 208C, flatness is achieved. Because of the flatness of the vertical workpiece portion in the second free-span zone 250B, the slits of the sealable gates 211D and 211F that are disposed vertically on opposite sides of the second deposition station 204 may be made very narrow to better prevent migration of the selenium vapors to adjacent deposition zones.

Similar to the first free-span zone 250A, the third free-span zone 250C also benefits a shorter free span zone and results in better sealing ability of the sealable gates 208C and 208D. In another embodiment, by adding driven rollers between the deposition zones, tension can be controlled independently. In the vertical deposition zone, the tension can be lower than in the horizontal sections, without sacrificing deposition uniformity. The tension required in each zone may depend on the web material, thickness, and width of the web, and may be within the range of 200 to 4000 N.

Figure 4A:
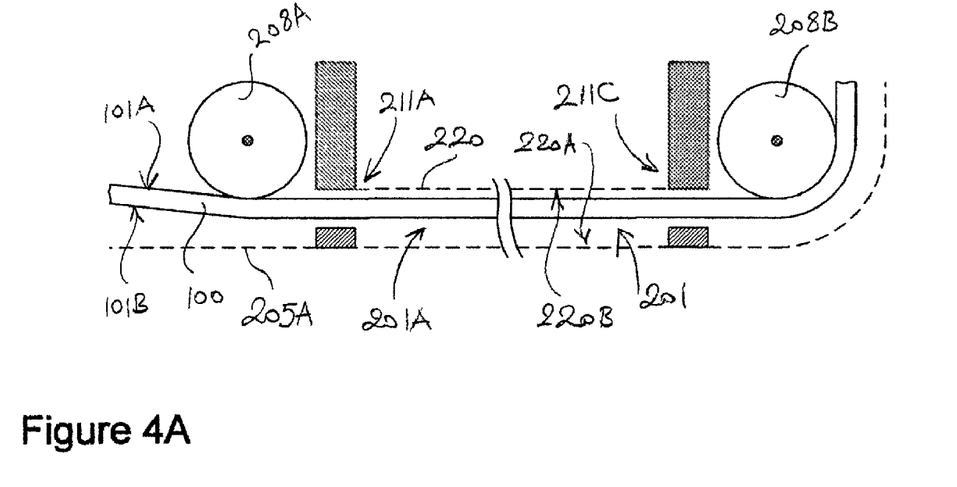
FIGS. 4A-4B are schematic side and front illustrations of a sealable gate as the flexible workpiece is advanced through an opening of the sealable gate in a free span position.
Figure 4B:
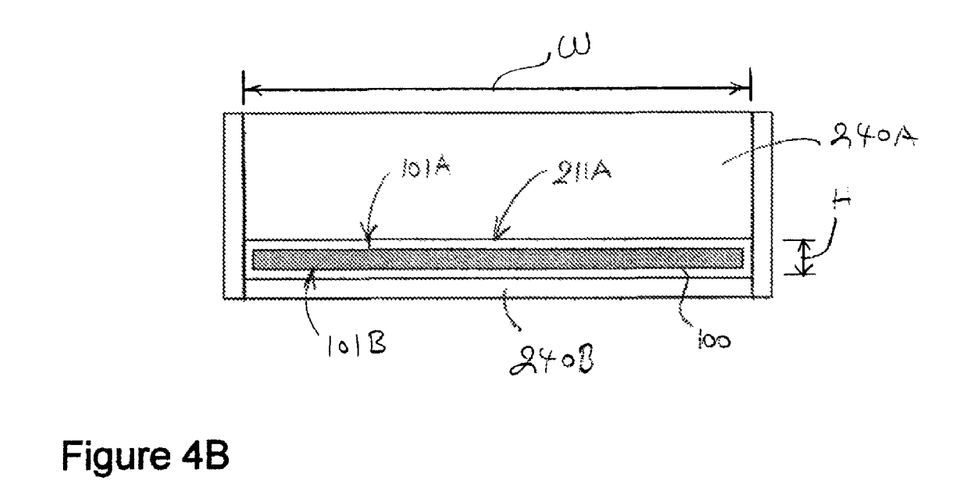

FIG. 4A shows another portion of the workpiece 100 in the first free-span zone 250A in detail. FIG. 4B shows the work piece 100 in front cross sectional view as it passes through one of the sealable gates such as the first sealable gate 211A. In this embodiment, the sealable gate 211A is a rectangular opening between an upper seal member 240A and a lower seal member 240B. Due to the flatness of the workpiece, the height 'H' and width 'W' of the opening may be made very close to the thickness and width of the workpiece 100. For instance, the width needs only to be 2-4 mm wider, preferably 2 mm wider, than the web to allow for some web misalignment. Since the deflection is minimized, the height of the opening can be reduced to 2-10 mm, preferably 2-5 mm, without causing mechanical interference.

The deposition system 200 may also include a metrology station (not shown) including an XRF analyzer located for example in the unloading station 205B of the system. The XRF analyzer measures the thickness of the deposited Se layer and provides feedback for a deposition control system. The XRF is positioned over a roller to ensure constant measurement height and measurement accuracy. Further, heating and cooling stations located before the deposition chambers anneal the workpiece at a controlled temperature.

Although the present inventions are described with respect to certain preferred embodiments, modifications thereto will be apparent to those skilled in the art.

We claim:

1. A roll-to-roll system for depositing a plurality of films of Group IA and Group VIA materials on a front surface of a continuous sheet shaped workpiece that is advanced in a process direction, comprising:
   a process housing through which the continuous sheet shaped workpiece is advanced between an entrance opening and an exit opening of the process housing, the process housing including a first process section located by a horizontal peripheral wall of the process housing and a second process section located by a vertical peripheral wall of the process housing, wherein the first process section is associated with a horizontally disposed portion of the continuous sheet shaped workpiece and the second process section is associated with a vertically disposed portion of the continuous sheet shaped workpiece;
   a workpiece tensioning and drive assembly for advancing the continuous sheet shaped workpiece in the process direction between the entrance opening and the exit opening of the process housing;
   a first vapor deposition unit disposed at the first process section to continuously vapor deposit a first film onto the horizontally disposed portion of the continuous sheet shaped workpiece by vertically directing a first vapor toward the first process section as the continuous sheet shaped workpiece is advanced through the at least first vapor deposition unit; and
   a second vapor deposition unit disposed at the second process section to continuously vapor deposit a second film that is different from the first film onto the vertically disposed portion of the continuous sheet shaped workpiece by horizontally directing a second vapor toward the second process section as the continuous sheet shaped workpiece is advanced through the at least second vapor deposition unit;
   wherein one of the first and second vapor deposition units vapor deposits directly onto a front surface portion of the continuous sheet shaped workpiece to obtain a new front surface portion and the other of the first and second vapor deposition units vapor deposits onto the new front surface portion, wherein the workpiece tensioning and drive assembly includes a plurality of rollers, wherein different portions of only a backside of the continuous sheet shaped workpiece rests on the plurality of rollers, and wherein each of the first and second vapor deposition units continuously vapor deposit toward a frontside of the continuous sheet shaped workpiece.

2. The system of claim 1 wherein the first vapor deposition unit deposits directly onto the front surface portion of the continuous sheet shaped workpiece to obtain the new front surface portion and the second vapor deposition unit deposits onto the new front surface portion.

3. The system of claim 2 wherein the depositing of the second film occurs while no physical contact exists with a corresponding back surface of the vertically disposed portion of the continuous sheet shaped workpiece disposed within the second vapor deposition unit as the second film is deposited.

4. The system of claim 2 further comprising a loading chamber and an unloading chamber sealably connected to the entrance opening and the exist opening of the process housing respectively.

5. The system of claim 2, wherein the loading chamber includes a supply roll from which the continuous sheet shaped workpiece is advanced using the workpiece tensioning and drive assembly into the process housing through the entrance opening, and wherein the unloading chamber includes a receiving roll that the continuous sheet shaped workpiece received from the process housing through the exit opening wraps around.

6. The system of claim 5, wherein the unloading station includes a metrology tool to measure thicknesses of the first and second films and provides feed back of the measured thicknesses of the first and second films to a deposition control system.

7. The system of claim 5, wherein the horizontally disposed portion of the continuous sheet shaped workpiece is disposed within the first process section in a horizontal free-span zone in which the horizontally disposed portion of the continuous sheet shaped workpiece is unsupported, the horizontal free span zone being established between a first roller and a second roller by tensioning the horizontally disposed portion of the continuous sheet shaped workpiece between the first roller and a second roller on which the back surface of the horizontally disposed portion of the continuous sheet shaped workpiece rests using the workpiece tensioning and drive assembly as the continuous sheet shaped workpiece is advanced within the first process section, wherein the horizontally disposed portion of the continuous sheet shaped workpiece is substantially flat in the horizontal free-span zone.

8. The system of claim 7, wherein a first sealable opening is placed between the first roller and the first process section, and a second sealable opening is placed between the first process section and the second roller to seal the first process section, and wherein the continuous sheet shaped workpiece passes through the first and the second sealable openings.

9. The system of claim 8, wherein the vertically disposed portion of the continuous sheet shaped workpiece is disposed within the second process section in a vertical free-span zone in which the vertically disposed portion of the continuous sheet shaped workpiece is unsupported, the vertical free span zone being established by tensioning the vertically disposed portion of the continuous sheet shaped workpiece between the second roller and a third roller on which the back surface of the vertically disposed portion of the continuous sheet shaped workpiece rests using the workpiece tensioning and drive assembly as the continuous sheet shaped workpiece is advanced within the second process section, wherein the vertically disposed portion of the continuous sheet shaped workpiece is substantially flat in the vertical free-span zone.

10. The system of claim 9, wherein a third sealable opening is placed between the second roller and the second process section, and a fourth sealable opening is placed between the second process section and the third roller to seal the second process section, and wherein the continuous sheet shaped workpiece passes through the third and the fourth sealable openings.

11. The system of claim 2, wherein the first vapor deposition unit is a first evaporation apparatus to vapor deposit the first film, and the second vapor deposition unit is a second evaporation apparatus to vapor deposit the second film.

12. The system of claim 11, wherein inner surfaces of the first and second peripheral walls are each shielded with a removable protective shield that collect excess vapor from the respective first and second evaporation apparatus.

13. The system of claim 11, wherein the first evaporation apparatus deposits a Group IA material and the second evaporation apparatus deposits a Group VIA material.

14. The system of claim 13, wherein the Group VIA material is Se, and wherein the Group IA material is one of Na, K and Li.

15. The system of claim 11, wherein the unloading station includes a metrology tool to measure thicknesses of the first and second films and provides feed back of the measured thicknesses of the first and second films to a deposition control system.

16. The system of claim 15, wherein the deposition control system controls the first evaporation apparatus, the second evaporation apparatus and the workpiece tensioning and drive assembly.

17. The system of claim 2, wherein the deposition of the first film occurs while no physical contact exists with a corresponding back surface of the horizontally disposed portion of the continuous sheet shaped workpiece disposed within the at least first vapor deposition unit as the first film is deposited.

18. The system of claim 1, wherein the at least second vapor deposition unit includes an evaporation apparatus to vapor deposit the second film.

19. The system of claim 18 wherein the evaporation apparatus is a Se evaporation apparatus that vapor deposits a Se film as the second film.

20. The system of claim 1 further comprising a sealable gate separating the first process section from the second process section thereby preventing cross contamination therebetween.

21. The system of claim 1 further comprising a cooling system disposed after the at least second deposition unit in the process direction to cool that portion of the continuous sheet shaped workpiece that passes therethrough.

* * * * *

UNITED STATES PATENT AND TRADEMARK OFFICE
CERTIFICATE OF CORRECTION

PATENT NO.       : 8,088,224 B2                         Page 1 of 1
APPLICATION NO.  : 12/769321
DATED            : January 3, 2012
INVENTOR(S)      : Jorge Vasquez It is certified that error appears in the above-identified patent and that said Letters Patent is hereby corrected as shown below:

On the title page, item [54] and col. 1, line 3: in the title, delete "IBIIAVIA" and insert -- IBIIIAVIA --.

Signed and Sealed this
Third Day of April, 2012

David J. Kappos
*Director of the United States Patent and Trademark Office*